United States Patent [19]

Mahl

[11] 4,296,153
[45] Oct. 20, 1981

[54] VACUUM CHAMBER DOOR ASSEMBLY AND METHOD

[75] Inventor: Gunard O. B. Mahl, San Francisco, Calif.

[73] Assignee: CHA Industries, Menlo Park, Calif.

[21] Appl. No.: 906,025

[22] Filed: May 15, 1978

[51] Int. Cl.³ .......................................... B05D 3/00
[52] U.S. Cl. .................................. 427/444; 34/242; 118/50; 118/733
[58] Field of Search ............... 118/48, 49, 49.1, 49.5, 118/50, 733; 34/242; 312/109, 138 R, 294, 311, 222, 307, 260; 427/444

[56] References Cited

U.S. PATENT DOCUMENTS

| | | | |
|---|---|---|---|
| 352,828 | 11/1886 | Lee | 312/138 R |
| 557,043 | 0/1896 | Adams | 118/48 |
| 1,984,345 | 12/1934 | Kennedy | 312/222 |
| 2,601,566 | 6/1952 | Soderquist | 49/254 X |
| 3,498,259 | 3/1970 | Braguier | 118/49 |
| 3,892,198 | 7/1975 | Dobson | 118/49 |

FOREIGN PATENT DOCUMENTS 1043143  7/1958  Fed. Rep. of Germany ........ 118/48
43611   1/1938  Netherlands .......................... 118/48

OTHER PUBLICATIONS

Metal Finishing Guide Book, 1959, 84–583.

*Primary Examiner*—Bernard D. Pianalto
*Attorney, Agent, or Firm*—Phillips, Moore, Weissenberger, Lempio & Majestic

[57] ABSTRACT

A vacuum deposition apparatus comprises a cabinet having a vacuum chamber defined therein. A door is movably mounted on the cabinet for movement between a closed position fully sealing an opening to the vacuum chamber and an opened position fully exposing the opening. The door is preferably mounted on the cabinet for swinging movements towards and away from the opening and for vertical sliding movements whereby the door may be moved downwardly to a remote position. The door is preferably counterweighted to facilitate its vertical sliding movements and is pivotally mounted on a bracket by self-centering bearing assemblies which are pre-adjusted to continuously insure a positive static seal as between the door and the opening to the vacuum chamber.

30 Claims, 5 Drawing Figures

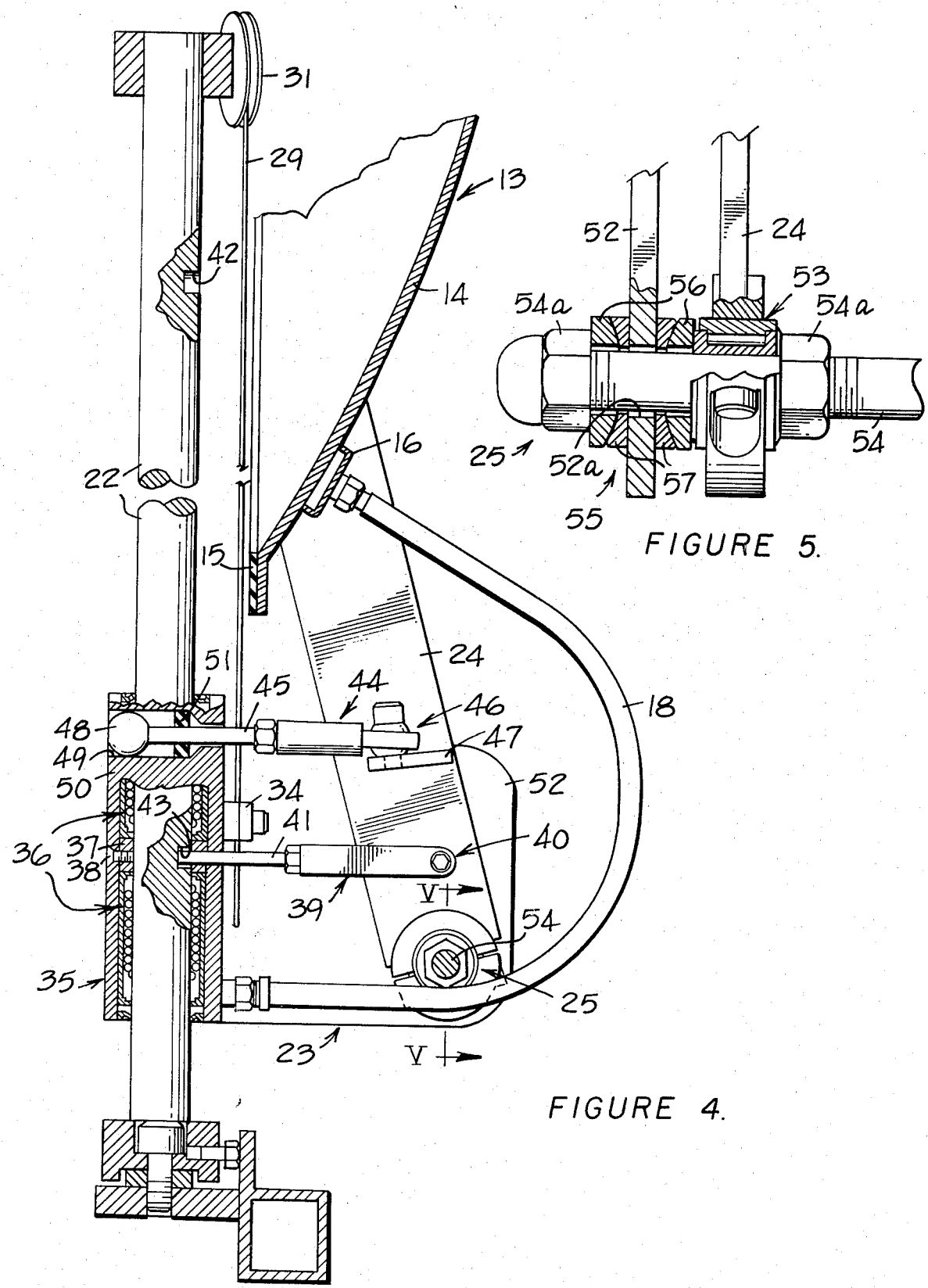

VACUUM CHAMBER DOOR ASSEMBLY AND METHOD

BACKGROUND OF THE INVENTION

This invention relates to a door assembly movably mounted on a vacuum deposition apparatus for selectively closing a vacuum chamber thereof and a method for loading and unloading such chamber with articles to be processed.

Apparatus of this type comprise a plurality of racks mounted in the vacuum chamber to retain a plurality of articles or substrates, such as silicon wafers, thereon. During the deposition process, the chamber is closed and the articles are subjected to a vaporized material, such as metal. U.S. Pat. No. 3,643,625, assigned to the assignee of this application and having common inventorship, discloses an apparatus for closing and sealing the vacuum chamber during the deposition process.

In particular, a glass bell jar is mounted on the apparatus to define the vacuum chamber therein. Mounting of the jar on the apparatus and removal therefrom upon completion of the process is obviously cumbersome and unduly time-consuming. In addition, the jar must be precisely placed on the apparatus to insure a positive static seal whereby a vacuum may be effectively drawn within the jar.

Another type of deposition apparatus comprises a split vessel having the two components thereof hingedly connected together by vertically disposed hinges. The latter arrangement also gives rise to sealing problems, requires an undue amount of space for opening purposes and hinders the operator in his free access to the vacuum chamber and to a control panel mounted adjacent to the vessel when it is opened. Similar problems are encountered with other types of deposition apparatus which have an openable door mounted thereon.

For example, one type of door opens upwardly which gives rise to the additional problem of operator safety should the door inadvertently fall towards a closed position. In another type of door arrangement, the door pivots sideways to open in a sideways direction and is moved downwardly. As suggested above, all of these types of doors exhibit the above sealing, space, operator hinderance and safety problems.

SUMMARY OF THIS INVENTION

An object of this invention is to overcome the above, briefly described problems by providing an apparatus with a door assembly for expeditiously and efficiently closing and opening a chamber, adapted to retain articles therein for processing. The door assembly is particularly useful for selectively opening or closing the vacuum chamber of a vacuum deposition apparatus.

The apparatus comprises a cabinet, defining the chamber therein, and the door assembly comprises a door mounted on the cabinet by mounting means for selectively moving the door between its closed and opened positions. In the preferred embodiment of this invention, the mounting means pivotally and slidably mounts the door on the cabinet whereby the door may be moved vertically downwardly to a remote, lowered position to facilitate ready access to the chamber by an operator. In addition, the door is preferably counterweighted to facilitate opening and closing thereof and cooling means are preferably provided on the door to aid in cooling the chamber.

BRIEF DESCRIPTION OF THE DRAWINGS

Other objects of this invention will become apparent from the following description and accompanying drawings wherein:

FIG. 4 is a sectional view, taken in the direction of arrows IV—IV in FIG. 2; and FIG. 5 is an enlarged sectional view of a self-aligning bearing assembly employed in the mounting means for the door assembly, taken in the direction of arrows V—V in FIG. 4.

DETAILED DESCRIPTION

Figure 1:
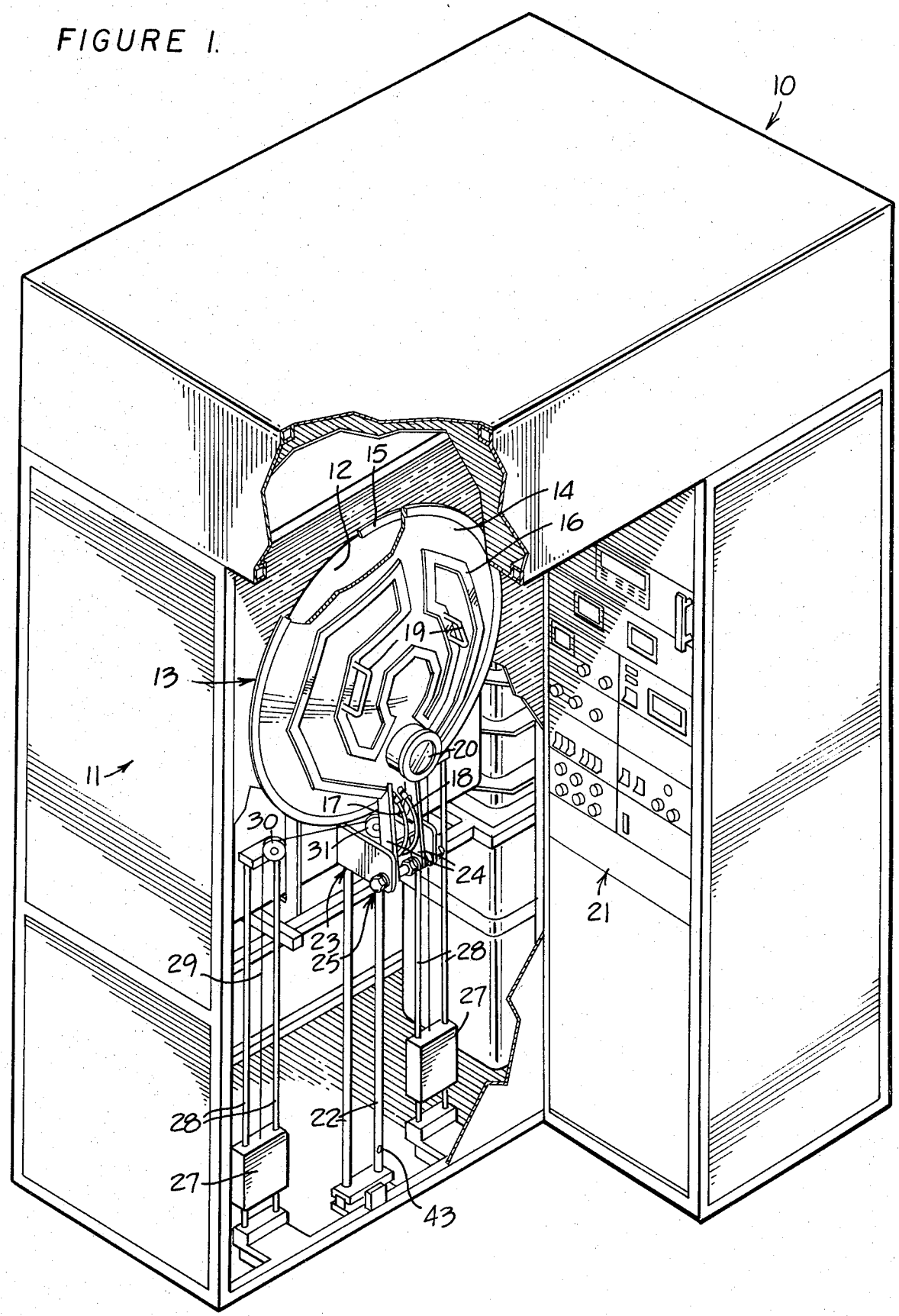
FIG. 1 is a partially sectioned perspective view of a vacuum deposition apparatus having the door assembly of this invention mounted thereon.

FIG. 1 illustrates a vacuum deposition apparatus 10 comprising a cabinet 11 defining a vacuum chamber 12 therein. As taught in U.S. Pat. No. 3,643,625, the vacuum chamber is adapted to have a plurality of racks (not shown) mounted therein whereby articles, such as silicon wafers, may be thin-coated with a vaporized metal in a conventional manner. As will be described more fully hereinafter, a door assembly 13 is movably mounted on the cabinet to normally close an inlet opening to the vacuum chamber and is adapted to be opened and disposed at a remote position relative to the chamber to facilitate loading and removal of the articles therefrom.

Although the door assembly of this invention finds particular application on such a vacuum deposition apparatus, it should be obvious to those skilled in the art that the door assembly has numerous other applications.

Figure 2:
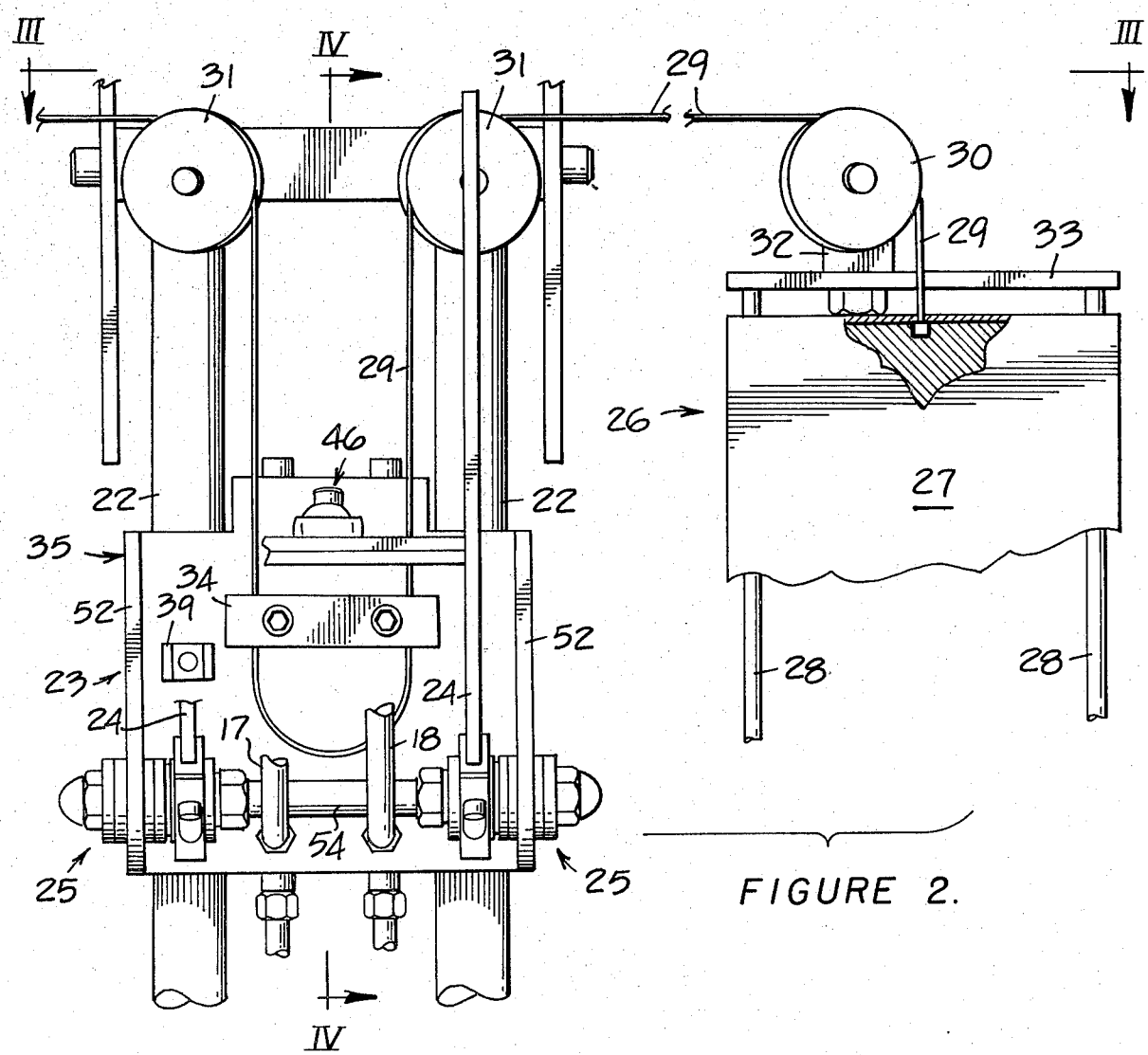
FIG. 2 is an enlarged front elevational view, partially illustrating mounting means for movably mounting the door assembly on a cabinet of the apparatus and a counterweight assembly associated therewith.

Door assembly 13 comprises a partially spherical door 14 having an annular sealing gasket 15 secured thereon (or, alternatively, to the cabinet) to form a static circular seal at the inlet opening to vacuum chamber 12. The sealing gasket may be of the type disclosed in U.S. Pat. No. 3,998,347. A plurality of intercommunicating and closed cooling channels 16 are formed on the door to circulate a fluidized coolant, such as water, therethrough. As shown in FIGS. 2 and 4, a pair of flexible inlet and outlet conduits 17 and 18, respectively, communicate with a pressurized source for circulating water or other suitable coolant through channels 16.

As further shown in FIG. 1, a pair of handles 19 are secured in laterally spaced relationship on channels 16 to retain the handles in a cooled condition when heat is generated in vacuum chamber 12 during the deposition process. As further shown, a window 20 is mounted on door 14 to visually inspect the processed articles with the aid of mirrors (not shown), suitably mounted in cabinet 10. A control panel 21 is mounted adjacent to door assembly 13 for selective manipulation by the operator to control the deposition process.

Mounting means, mounting door assembly 13 on the cabinet for movement between its closed and opened positions, comprises a pair of vertically disposed and parallel guide rods 22 having a bracket assembly 23 slidably mounted thereon. A pair of arms 24 are secured to door 14 and are pivotally mounted on bracket assembly 23 by preadjusted, self-aligning pivot means 25, described in detail hereinafter. In general, pivot means 25 will provide door 14 with a slight self-adjusting, universal movement during pre-adjustment thereof to continuously assure full circumferential sealing contact as between gasket 15 and the cabinet.

Figure 3:
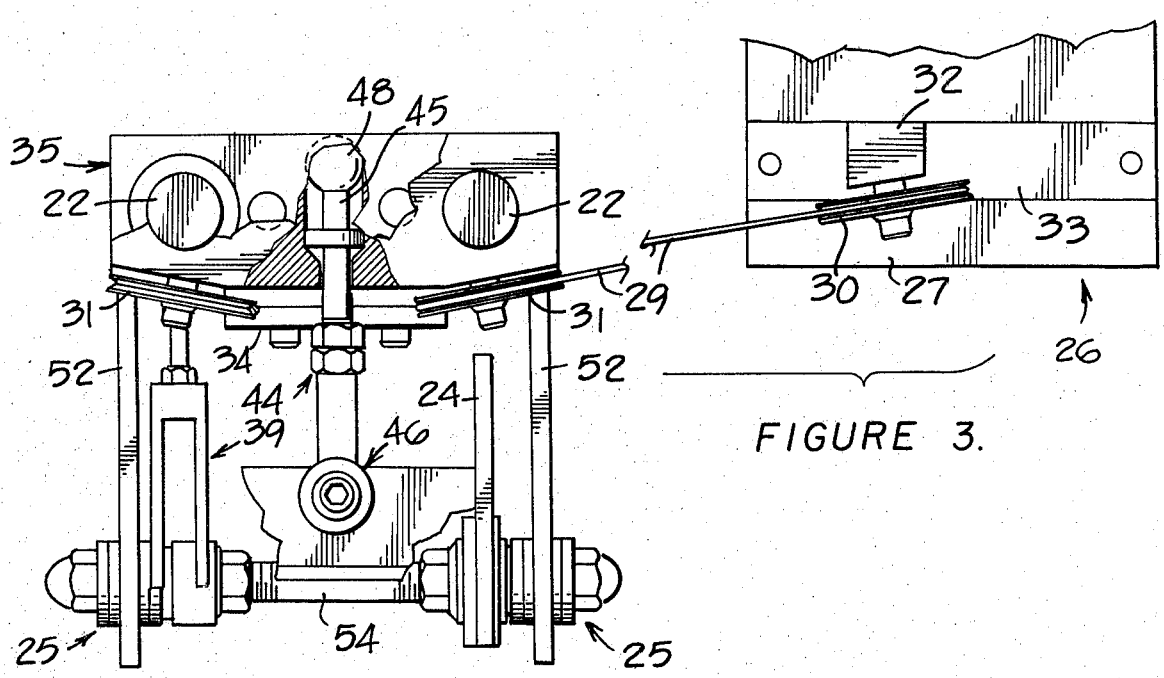
FIG. 3 is a top plan view, taken in the direction of arrows III—III in FIG. 2.

Referring to FIGS. 2 and 3, a pair of counterweight means or assemblies 26 are operatively connected to bracket assembly 23 to aid the operator in raising and lowering the bracket assembly and attached door assembly 13 by counterbalancing the weight thereof. Each counterweight assembly comprises a weight 27 slidably mounted on a pair of vertically disposed guide rods 28 having their lower ends suitably secured to a base of the cabinet, as shown in FIG. 1. A common flexible cable 29 is secured to the weight and is entrained over a pair of pulleys 30 and 31 rotatably mounted on the cabinet.

First pulley 30 is rotatably mounted on a bracket 32 detachably secured to a plate 33 which is, in turn, secured to the upper ends of rods 28. Second pulley 31 is rotatably monted on an upper end of a respective rod 22. A clamping plate 34 secures cable 29 to bracket assembly 23 and is adapted to selectively adjust the length of the cable and thus the relative position of weight 27 on rods 28.

Referring to FIGS. 2 and 4, bracket assembly 23 has a block 35 which is slidably mounted on each rod 22. A pair of ball-bushing assemblies 36 are disposed in the block and slidably mounted on the rod to substantially reduce the coefficient of sliding friction therebetween. An annular collar 37, held in place on the sleeve by a set screw 38, separates the ball-bushing assemblies.

A lock means 39 is pivotally mounted on one arm 24 of the door assembly by a pivot means 40, such as a socket head screw. The lock means comprises an axially adjustable rod 41 adapted to have an end thereof engage recess 42 or 43 formed in one rod 22. As shown in the lowered position of door 14 in FIG. 4, the rod extends through holes, formed through block 35 and collar 37, which are in alignment with engaged recess 43.

Thus, the lock means functions to limit vertical movement of door assembly 13 when it is in either its raised and closed position over vacuum chamber 12 or in its lowered position and when titled towards the cabinet to engage recess 43. The lock means may be adjusted axially to prevent the end thereof from engaging rod 22 before the static seal is formed between gasket 15 and the cabinet upon closing of the door. In the position illustrated in FIG. 1, the door is maintained at its raised and closed position on the cabinet whereby rod engages recess 42 to prevent the door from moving vertically downwardly prior to when the door is pivoted outwardly away from the cabinet to its opened position. Thus, scuffing of sealing gasket 15 is prevented. It should be noted that the spherical shape of the door increases the capacity of the vacuum chamber and the rearward tilting and subsequent lowering of the door prevents interference with tooling (racks, tracks, etc.) in the chamber.

FIGS. 3 and 4 illustrate stop means 44 for limiting outward movement of the door assembly, away from the cabinet. The stop means comprises an axially adjustable rod 45 connected to arm 24 by pivot means 46, such as a socket head screw. The screw is preferably threadably mounted to a plate 47, secured to arm 24, whereby pivot means 46 may be released to permit door assembly 13 to be pivoted downwardly 180° relative to its raised, vertical position illustrated in FIG. 4, if so desired.

The opposite end of rod 45 has a stop member or ball 48 secured thereon which is reciprocally mounted in a bore 49, defined in an upper portion 50 of block 35 of bracket assembly 23. An annular elastomeric washer 51 is secured in the bore to limit outward movement of the door assembly relative to the cabinet, i.e., clockwise pivoting of the door assembly about pivot means 25 in FIG. 4 to a position wherein the center of gravity of the door assembly is placed slightly rightwardly (overcenter) of the pivot axis of pivot means 25. Thus, rods 41 and 45 may be preadjusted to permit opening of the door for raising or lowering purposes with rod 41 being removed from recess 42 or recess 43 while yet permitting the end of the rod to be retained within the confines of the holes formed through sleeve 35 and collar 37.

FIG. 5 illustrates the details of pivot means 25 for pivoting each arm 24 of the door assembly on a respective bracket 52 of bracket assembly 23, secured to block 35. As shown, a needle bearing assembly 53 pivotally mounts each arm 24 on a shank of a common pin or bolt 54. The bolt is mounted for slight universal movement, upon release of nuts 54a, on each bracket 52 by a semispherical and self-aligning bearing assembly 55.

The bearing assembly comprises a pair of outer washers 56 each having an inner convex (spherically-shaped) bearing surface formed thereon which mates within an outer concave bearing surface, formed on a respective inner washer 57. Upon release of nuts 54a and upon closing of door assembly 13 on the cabinet, gasket 50 and the contacting sealing surface of the cabinet may be precisely aligned to form an impervious static seal therebetween. In this regard, it should be noted that the bearing assemblies 53 are capable of axial movement on bolt 54, that elongated slots 52a permit slight vertical and tipping movements of bolt 54 relative to brackets 52 and tha self-aligning bearing assemblies exhibit universal movement whereby the above seal may be preadjusted in a precise manner. Subsequent to such preadjustment, nuts 54a are tightened whereby the seal alignment will be continuously maintained even after repeated opening and closing of the door assembly. The vacuum drawn within chamber 12 (FIG. 1) will aid in drawing door 14 and thus the gasket into intimate sealing contact with the cabinet.

In operation, an operator desiring to place a plurality of articles within vacuum chamber 12 for processing purposes would grasp handles 19 to pull and pivot door assembly 13 outwardly. As shown in FIG. 4, ball 48 will engage washer 51 to limit the outward movement of the door assembly to a position whereby the end of rod 41 will be released from aperture 42, but will still be retained within block 35. The door may then be moved downwardly, under the control of counterweight assemblies 26, to its lowered position whereafter the door assembly may be moved forwardly slightly to engage rod 41 with recess 43 (FIG. 4). Thus, the door is disposed at a remote location whereby the operator is not hindered in his placement of articles in the vacuum chamber.

Subsequent to such placement, the operator will again grasp handles 19 and pull on the door assembly to release rod 41 from aperture 43. The door may then be raised and repositioned to its closed position shown in FIG. 1. Rod 41 will re-engage within recess 42 whereby gasket 15 will provide a positive static seal between the door and cabinet with the aid of the vacuum drawn within vacuum chamber 12. As discussed above, cooling channels 16 are provided on door 14 to aid in cooling the vacuum chamber. Furthermore, handles 19 are secured on the channels to maintain them in a cooled condition whereby the operator may grasp them without incurring injury to his hands.

I claim:

1. An apparatus comprising a cabinet defining a vacuum chamber therein, and a door assembly movably mounted on said cabinet to normally close an opening to said vacuum chamber, the improvement comprising mounting means mounting said door assembly on said cabinet (1) for initial pivotal movement between a closed position normally closing the opening to said vacuum chamber and an open position pivoted outwardly away from said vacuum chamber for fully exposing said opening, and (2) for further movement, following and independent of said pivotal movement, to a position remote from said opening.

2. The apparatus of claim 1 wherein said mounting means comprises a bracket assembly having said door assembly pivotally mounted thereon.

3. The apparatus of claim 2 wherein said mounting means further comprises means mounting said bracket assembly for vertical movements on said cabinet between a raised position adjacent to said chamber and a lowered position remote from said chamber.

4. The apparatus of claim 3 wherein said means mounting said bracket assembly for vertical movements on said cabinet comprises at least one vertically disposed rod having said bracket assembly reciprocally mounted thereon.

5. The apparatus of claim 4 wherein a pair of said rods reciprocally mount said bracket assembly thereon.

6. The apparatus of claim 2 wherein said door assembly comprises a door having a pair of laterally spaced arms secured thereon and wherein said bracket assembly comprises a pair of laterally spaced brackets, each of said arms pivotally mounted on a respective one of said brackets.

7. The apparatus of claim 4 wherein said bracket assembly further comprises a block and anti-friction bearing means reciprocally mounting said block on said rod.

8. The apparatus of claim 2 further comprising an annular sealing gasket disposed between said cabinet and said door assembly for sealing said chamber upon closing said door assembly and wherein said mounting means further comprises pivot means pivotally mounting said door assembly on said bracket assembly and for permitting pre-alignment of said door assembly relative to said cabinet whereby said sealing gasket will seal said chamber upon closing of said door assembly.

9. The apparatus of claim 8 wherein said pivot means comprises a pin and self-aligning bearing means mounting said pin or said bracket assembly.

10. The apparatus of claim 9 wherein said self-aligning bearing means comprises a pair of outer washers mounted on said pin and having spherically-shaped bearing surfaces formed on inner surfaces thereof and a pair of inner washers mounted on said pin and having spherically-shaped bearing surfaces formed on outer surfaces thereof and disposed in bearing relationship relative to the inner surfaces formed on said outer washers.

11. The apparatus of claim 1 further comprising lock means mounted on said door assembly and engageable with said bracket for locking said door assembly against vertical movement relative to said cabinet when said door assembly is maintained in its closed position and for permitting vertical movement of said door assembly when it is pivoted to its opened position.

12. The apparatus of claim 2 further comprising lock means for locking said door assembly against vertical movement (1) when said door assembly is maintained in its raised and closed position and (2) when said door assembly is maintained in its lowered and vertical downward position remote from said opening.

13. The apparatus of claim 12 wherein said bracket assembly is slidably mounted for vertical movements on at least one vertically disposed rod, a pair of longitudinally spaced recesses defined in said rod to correspond to raised and lowered positions of said door assembly on said rod and wherein said lock means comprises a rod mounted on said door assembly and having an end thereof normally disposed in one of said recesses to prevent vertical movement of said door assembly relative to said rod.

14. The apparatus of claim 2 further comprising stop means pivotally mounted on said door assembly and engageable with said bracket assembly for limiting pivotal outward movement of said door assembly away from said cabinet.

15. The apparatus of claim 14 wherein said stop means comprises a rod pivotally mounted on said door assembly and having a stop member secured on an end thereof, said stop member reciprocally mounted in a bore defined in said bracket assembly.

16. The apparatus of claim 15 wherein said stop means further comprises a washer mounted in said bore and adjacent to said stop member for limiting outward movement thereof.

17. The apparatus of claim 3 further comprising counterweight means connected to said bracket assembly for counterbalancing the weight of said bracket assembly and said door assembly upon movement thereof between its raised and lowered positions on said cabinet.

18. The apparatus of claim 17 wherein said counterweight means comprises a pair of weights slidably mounted for vertical movements on said cabinet, a plurality of pulleys rotatably mounted on said cabinet and flexible cable means secured between said weights and said bracket assembly and entrained over said pulleys.

19. The apparatus of claim 1 further comprising a plurality of intercommunicating channels formed exteriorly on said door assembly and means for circulating a coolant through said channels.

20. The apparatus of claim 19 further comprising handle means secured on said channels for maintaining said handle means in a cooled condition.

21. The apparatus of claim 1 further comprising at least one window mounted on said door assembly for visually inspecting said vacuum chamber.

22. A method for loading and unloading a vacuum chamber defined in an apparatus with at least one article to be processed comprising the steps of movably mounting a door assembly on said apparatus for movement between closed and opened positions relative to said chamber, pivoting said door assembly away from said chamber, moving said door assembly vertically downwardly to a remote, lowered position vertically below said chamber, placing an article to be processed in said chamber, moving said door assembly vertically upwardly to a raised position, and pivoting said door assembly inwardly into closed and sealed relationship with respect to said chamber.

23. The method of claim 22 further comprising the step of counterbalancing said door assembly upon its movements between its raised and lowered positions on said apparatus.

24. The method of claim 22 further comprising the step of pre-adjusting said door assembly on said apparatus to provide a static seal between said door assembly and said chamber and thereafter locking said door assembly in position on said apparatus to continuously assure said seal upon opening and closing of said door assembly.

25. The method of claim 22 further comprising the step of circulating a coolant through said door assembly.

26. The method of claim 25 further comprising the step of passing said coolant in close proximity to handle means secured exteriorly on said door assembly for maintaining said handle means in a cooled condition for the hands of an operator.

27. The method of claim 22 further comprising the step of limiting outward movement of said door assembly relative to said apparatus upon opening of said door assembly.

28. The method of claim 22 further comprising the step of selectively locking said door assembly against vertical movement relative to said apparatus when said door assembly is maintained in at least one vertical position relative to said apparatus.

29. The method of claim 28 wherein said step of selectively locking said door assembly comprises the steps of locking said door assembly against vertical movement when said door assembly is maintained in each of its raised and lowered positions.

30. The apparatus of claim 2, wherein said bracket assembly is pivotally mounted to said door assembly adjacent a periphery of said door assembly.

* * * * *